(12) United States Patent
Salcedo et al.

(10) Patent No.: US 8,044,457 B2
(45) Date of Patent: Oct. 25, 2011

(54) TRANSIENT OVER-VOLTAGE CLAMP

(75) Inventors: Javier Salcedo, North Billerica, MA (US); Alan Righter, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 162 days.

(21) Appl. No.: 12/493,692

(22) Filed: Jun. 29, 2009

(65) Prior Publication Data

US 2010/0327342 A1    Dec. 30, 2010

(51) Int. Cl.
*H01L 29/788* (2006.01)
(52) U.S. Cl. ............... 257/328; 257/E29.257; 257/500
(58) Field of Classification Search ............ 257/328, 257/E29.257
See application file for complete search history.

(56) References Cited

U.S. PATENT DOCUMENTS

| | | | |
|---|---|---|---|
| 6,137,140 A | 10/2000 | Efland et al. | |
| 6,590,273 B2 * | 7/2003 | Okawa et al. | 257/544 |
| 6,667,870 B1 | 12/2003 | Segervall | |
| 7,038,280 B2 | 5/2006 | Righter | |
| 7,071,528 B2 * | 7/2006 | Ker et al. | 257/492 |
| 7,232,705 B2 | 6/2007 | Righter | |
| 7,335,543 B2 | 2/2008 | Chen et al. | |
| 7,345,341 B2 | 3/2008 | Lin et al. | |
| 7,601,991 B2 | 10/2009 | Salcedo et al. | |
| 2005/0087807 A1 | 4/2005 | Righter | |
| 2006/0186467 A1 | 8/2006 | Pendharkar et al. | |
| 2008/0067601 A1 | 3/2008 | Chen | |

OTHER PUBLICATIONS

Anderson et al., ESD Protection under Wire Bonding Pads, EOS/ESD Symposium 99-88, pp. 2A.4.1-2A.4.7.
International Search Report and Written Opinion, dated Mar. 25, 2011, in PCT Appl. No. PCT/US2011/020036, filed Jan. 3, 2011.

* cited by examiner

*Primary Examiner* — Bradley K Smith
*Assistant Examiner* — Mohammad Karimy
(74) *Attorney, Agent, or Firm* — Knobbe Martens Olson & Bear LLP

(57) ABSTRACT

In various embodiments, the invention relates to semiconductor structures, such as planar MOS structures, suitable as voltage clamp devices. Additional doped regions formed in the structures may improve over-voltage protection characteristics.

22 Claims, 15 Drawing Sheets

TEST PARAMETERS

LEAKAGE TEST VOLTAGE: 15.00 V
LEAKAGE CURRENT LIMIT: 2.50E-3 A
MAXIMUM PULSE VOLTAGE: 250.00 V
START PULSE VOLTAGE 0.50 V
TEST STEP VOLTAGE: 1.00 V
PULSE CURRENT LIMIT: 3.00 A
PULSE WIDTH: 100 ns
PULSE RISE TIME: 10.0 ns

TRANSIENT OVER-VOLTAGE CLAMP

FIELD OF THE INVENTION

Embodiments of the invention relate, generally, to semiconductor structures for over-voltage protection, and methods of manufacturing the same. More particularly, various embodiments relate to planar high-voltage metal-oxide-semiconductor structures operable as fast transient over-voltage clamps.

BACKGROUND

Emerging high-voltage integrated circuits (ICs) are increasingly susceptible to damage resulting from electrical overstress (EOS) and electrostatic discharge (ESD), i.e., sudden unwanted voltage build-up and currents due to electrical charge displacement during IC assembly and system handling or operation. This is, in particular, a limiting factor in the design for reliability for those technologies that combine devices operating at a variety of internal and external interface voltage levels, such as advanced imaging and industrial systems technologies.

Clamp circuits are often used to shunt ESD currents between the power supply rails of the IC and limit voltage spikes, thereby protecting the internal elements from damage. In the absence of excess voltages at the IC input or output, the clamp circuits should not affect operation of the full IC system. Thus, the current flow through the clamp device is close to zero at voltages up to a trigger voltage level at which current conduction occurs, which should be significantly above the operating voltage of the IC, but below a predetermined voltage level where relatively small internal circuit devices can suffer damage due to the over-voltage condition. Once the trigger voltage is reached, the clamp becomes conductive. In some clamp devices, the voltage between the terminals of the clamp structure then drops to a holding voltage below the trigger voltage, in which condition the device is able to discharge a larger amount of current and dissipate a relatively low power per unit area. Following this current-voltage "snapback," the clamp device typically conducts a high transient current between its terminals, and if the current conduction condition is not destructive, the leak current at the lower operating voltage stays in the nano-Ampere regime after the overvoltage stress condition has passed.

Many clamp circuits implemented as metal-oxide-semiconductor (MOS) structures are variations of standard low-voltage or high-voltage MOSFET structures. In particular, for high-voltage applications, high-voltage double-diffused (vertical) metal-oxide semiconductor (DDMOS) or planar extended-drain MOS devices may be used. These MOS structures, which are able to operate at relatively large voltages, are themselves very sensitive to ESD-induced damage because they conduct currents largely near the surface, and exhibit limited bulk conduction (i.e., current conduction in deeper regions of the substrate). Failing devices typically develop a large electric field close to the high-voltage MOS junction breakdown voltage (i.e., the trigger voltage), followed by soft failure after a first snapback, and final permanent damage after a second snapback. Soft failure is typically characterized by an initial increase in the leakage current of the device, which poses reliability problems over time and degrades the power efficiency of the system. After a soft-failure, the device is still functional, but elevated leakage currents are more likely obtained under subsequent stress conditions, which may result in permanent device damage. This intrinsic sensitivity to ESD stress renders it difficult to meet customer- and industry-standard reliability requirements in IC applications using conventional high-voltage MOS technologies, and to enable more extensive and advanced circuit functionality on the same chip.

These technology challenges may be addressed by stacking multiple low-voltage devices to implement a higher-voltage ESD switch. However, the feasibility of this approach depends on the ability to isolate the low-voltage devices from the substrate, and to allocate large area for the high-voltage input-output (IO) terminals and the clamp implementation. Due to cost and manufacturing considerations, isolating the devices to realize high-voltage clamping is not practicable in a number of high-voltage mixed-signal developments. In high-voltage technologies where buried layer or deep-well isolation cannot be used in the implementation of the clamp, it is not feasible to stack devices because the high-voltage and low-voltage devices share a common substrate, and the low-voltage devices cannot be connected directly to a high-voltage input or output terminal. Further, isolating layers form reverse-biased junctions with the semiconductor substrate during normal circuit operation and—due to the large area of the junction—can result in significant leakage buildup. Leak current injection, in turn, degrades the energy efficiency of the IC system.

An alternative solution involves large high-voltage planar MOS designed to self-protect during a high ESD transient over-voltage. This large-foot-print approach may be practical for output drivers that need to handle high current levels and meet predetermined on-state resistance and switching speed requirements. However, many emerging output driver circuits include relatively small HV-MOS devices, and, thus, are not self-protected. Over-sizing the device is often not possible due to circuit functionality, energy efficiency, packaging, cost, and silicon-area constraints. Further, high-voltage power-supply clamps that include large high-voltage planar MOS also provide a large capacitance and may be sensitive to false activation by fast voltage changes.

Accordingly, there is a need for effective, small-footprint over-voltage clamp structures for high-voltage MOS applications.

SUMMARY

The present invention provides semiconductor structures suitable as over-voltage clamp devices, and which combine a small footprint with rapid triggering. In particular, in various embodiments, planar high-voltage MOS devices are modified with additional doped regions to provide for an increased conductivity modulation across the (parasitic) lateral bipolar junctions, which decreases surface junction over-heating and provides a better control of the critical electric field in the drain-body junction. Certain structures may be implemented directly on-chip. Preferred embodiments do not exhibit soft-failure leakage after first snapback, and greatly extend the ESD robustness while significantly reducing the total on-chip device area. Clamp structures and devices in accordance with various embodiments may be used at the input or output, or between power rails, of high-voltage circuits, such as high-voltage mixed-signal circuits. The term MOS as used herein includes structures wherein the gate is made of polysilicon, as opposed to metal, and/or wherein the isolating layer is of a material other than an oxide.

In a first aspect, the invention provides, in various embodiments, a voltage clamp device including a substrate, adjacent first and second lightly doped deep regions of opposite conductivity types formed in the substrate, first and second highly doped shallow regions of opposite conductivity type formed in the first deep region, third and fourth highly doped shallow regions of opposite conductivity type formed in the second deep region, a gate structure, and first and second terminals. The two conductivity types are n-type conductivity (imparted by electrons as majority carriers) and p-type conductivity (imparted by holes as majority carriers). The four lightly doped regions are arranged in an order such as to alternate in conductivity type, and such that, in each deep region, the shallow region that is closer to the junction with the other deep region (say, for ease of reference, the second or third shallow region, respectively) is of a conductivity type opposite that of the respective deep region in which it is formed.

The first electrode is connected to at least the first shallow region (which is of the same conductivity type as the first deep region) and, optionally, also to the second shallow region. The second electrode is connected to at least the third shallow region (which is also of the same conductivity type as the first deep region), and, optionally, also to the fourth shallow region. The gate structure includes an insulating layer and a gate electrode disposed thereover. It is located between the two terminals, and overlaps at least the second deep region.

In some embodiments, the voltage clamp device further includes an epitaxial layer formed within the substrate underneath the deep regions. The epitaxial layer and the substrate may be of opposite conductivity types. The clamp device may also include a deep implant layer between the epitaxial layer and the deep regions. In some embodiments, a medium-doped region of the same conductivity type as the first deep region and encompassing the first and second shallow regions may be embedded in the first and part of the second deep regions. An edge of the medium-doped region may be flush with the nearest edge of the gate structure.

In certain embodiments, the clamp device includes a lightly doped third deep region of the same conductivity type as the second deep region, formed in the substrate adjacent the first deep region and opposite the second deep region; a highly doped fifth shallow region of the same conductivity type as the second shallow region, formed in the first deep region on a side of the first shallow region opposite the second shallow region; and highly doped sixth and seventh shallow regions of opposite conductivity types, formed in the third deep region, the region closer to the junction between the first and third deep regions being of the same conductivity type as the first deep region.

In some embodiments, the clamp device includes one or more isolating barriers, such as, for example, shallow trench isolation (STI) or a ballasting oxide barriers. The isolating barrier(s) may be located between some or all of the shallow regions within each deep region, and/or between the second (and, if applicable, fifth) shallow region in the first deep region, and the second (and, if applicable, third) deep region.

In a second aspect, the invention provides a topologically symmetric voltage clamp device, which may, but need not also be geometrically symmetric. The device includes a substrate and, formed in the substrate, a lightly doped first deep region of one conductivity type and, adjacent the first deep region on opposite sides thereof, lightly doped second deep regions of the opposite conductivity type. Further, it includes three highly doped shallow regions formed in the first deep region, and two highly doped shallow regions in each of the second deep regions. The device also includes first and second terminals, and gate structures. The shallow regions are configured such that their conductivity types alternate, the center shallow region in the first deep region being of the same conductivity type as the first deep region. The first terminal is electrically connected to that center shallow region (and, optionally, also the other two shallow regions in the first deep region), and the second terminal is connected to the shallow regions in the second deep regions that are closer to the respective junction with the first deep region (and, optionally, also the other shallow regions in the second deep regions). The gate structures include insulating layers and gate electrodes disposed thereon, and overlap the second deep regions at least partially. In some embodiments, the first and second deep regions, and the shallow regions within each deep region that are closer to the junctions between the deep regions, collectively have a thyristor-type response.

In a third aspect, the invention provides, in various embodiments, a planar MOS structure operative as a voltage clamp. The MOS structure includes a gate structure and first and second highly doped regions of opposite conductivity types on opposite sides of the gate structure. The second highly doped region is separated from the gate structure by (i) a third highly doped region of opposite conductivity type (i.e., of the same conductivity type as the first highly doped region), and (ii) spacing and/or ballasting. The planar MOS structure may further include a fourth highly doped region of opposite conductivity type than the first region, located such that the fourth region and the gate are on opposite sides of the first region. The first and second highly doped regions may be connected to first and second terminals, respectively, and a voltage between the first terminal and the gate may be lower than a voltage between the second terminal and the gate.

In a fourth aspect, various embodiments provide an electronic circuit including an integrated circuit and, connected to an input or output or between power rails of the integrated circuit, a planar MOS structure operative as a voltage clamp in accordance with the third aspect of the invention. In some embodiments, the planar MOS structure may, in the absence of over-voltage conditions, function as a regular MOSFET.

BRIEF DESCRIPTION OF THE DRAWINGS

The foregoing discussion will be understood more readily from the following detailed description of the invention when taken in conjunction with the accompanying drawings, in which.

DETAILED DESCRIPTION

Figure 1A:
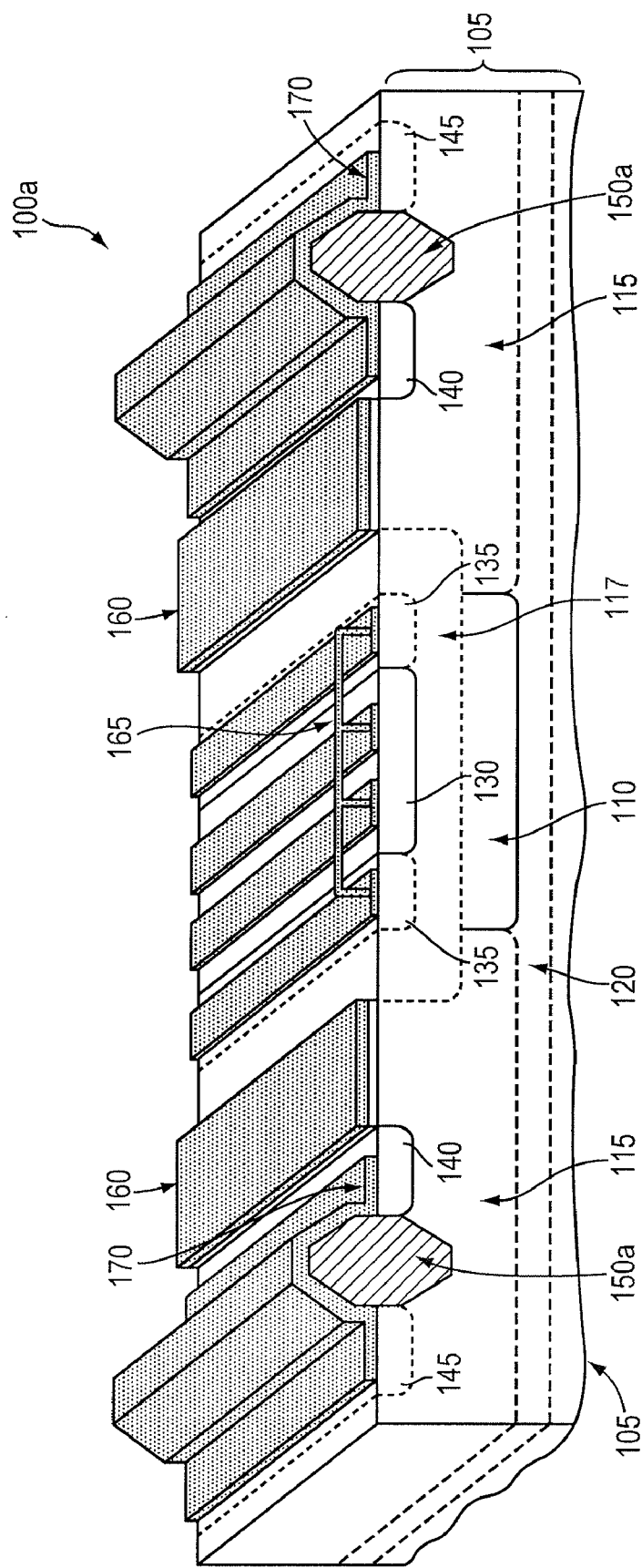
FIGS. 1A-1C are schematic perspective diagrams of topologically symmetric clamp structures in accordance with various embodiments of the invention.
Figure 1B:
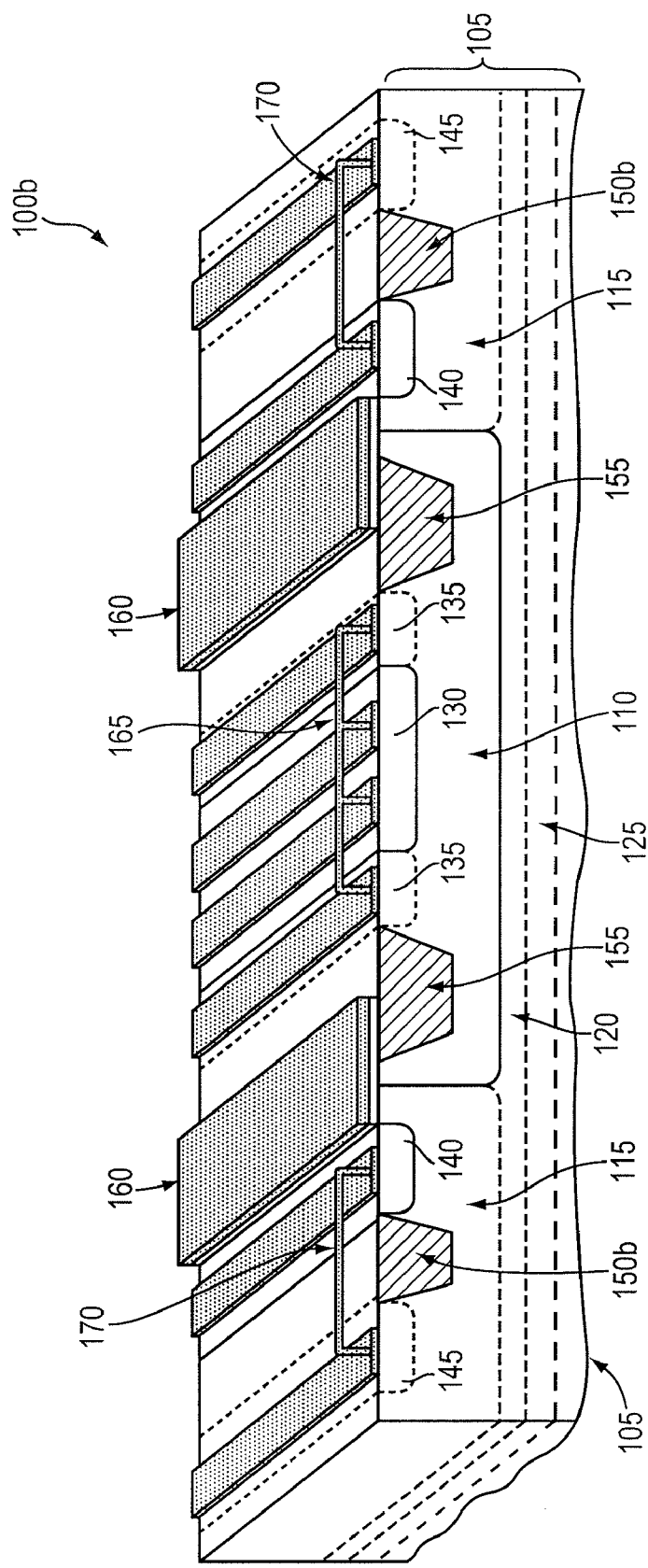
Figure 1C:
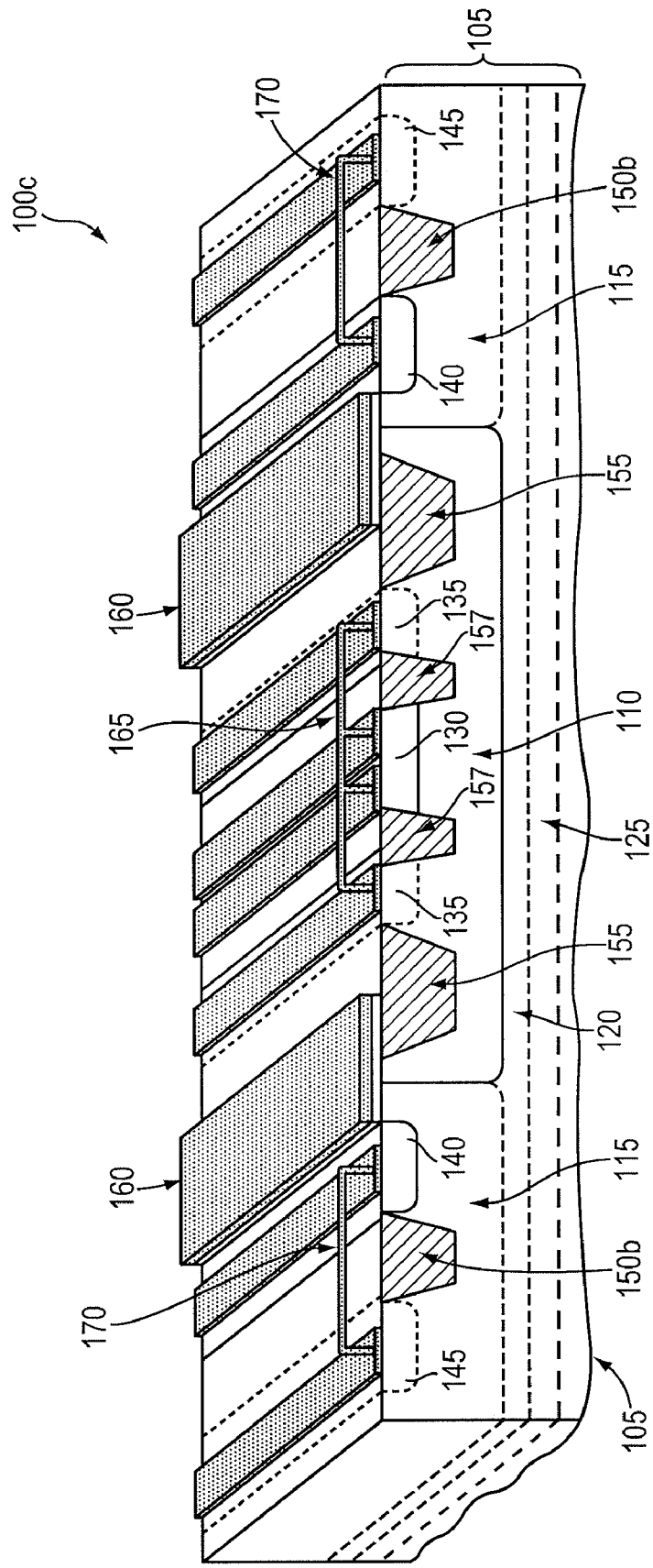

The present invention provides, in various embodiments, transient over-voltage clamp devices with improved protection characteristics. FIGS. 1A-1C illustrate exemplary planar MOS embodiments 100a, 100b, and 100c. These and other embodiments of the invention can be produced using standard semiconductor device fabrication techniques, including silicon epitaxy, layer deposition and patterning, doping by ion implantation or diffusion, and subsequent metal interconnecting.

Each of the exemplary structures 100a, 100b, 100c comprises a semiconductor substrate 105 (e.g., silicon) and, embedded therein, doped deep-well regions 110, 115 of alternating conductivity types. For example, a central well 110 may be doped with a negative dopant (e.g., group V atoms such as phosphorus or arsenic), and the adjacent wells 115 to both sides may, accordingly, be doped with a positive dopant (e.g., group III atoms such as boron). Between the deep-well regions 110, 115, a metallurgical junction forms, which blocks currents during normal operation, i.e., at voltages below breakdown conditions.

In certain embodiments, illustrated in FIG. 1A, a double-diffused region 117 may further be formed primarily in the central well 110 and reaching into the adjacent wells 115. This double-diffused region 117 is of the same conductivity type as the central well 110, and has a higher dopant concentration. In some embodiments, the deep-well regions 110, 115 may be butted, or formed at a certain distance from each other, to adjust the conductive characteristic of the structure in response to over-voltage conditions. Underneath the deep-well regions 110, 115, an isolating implant layer 120 may be formed in the substrate 105. Additionally, an epitaxial layer 125 may be formed underneath the isolating implant, as shown in FIGS. 1B and 1C. The substrate 105 typically has high sheet resistance. It may be lightly doped with a dopant of positive or negative conductivity type. In some embodiments, the optional isolating and/or epitaxial layers 120, 125 are of the opposite conductivity type than the substrate. In alternative embodiments, the epitaxial layer and the substrate are of the same conductivity type. The substrate properties may be selected so as to optimize the MOS device vertical conduction properties and trigger voltage.

Figure 1D:
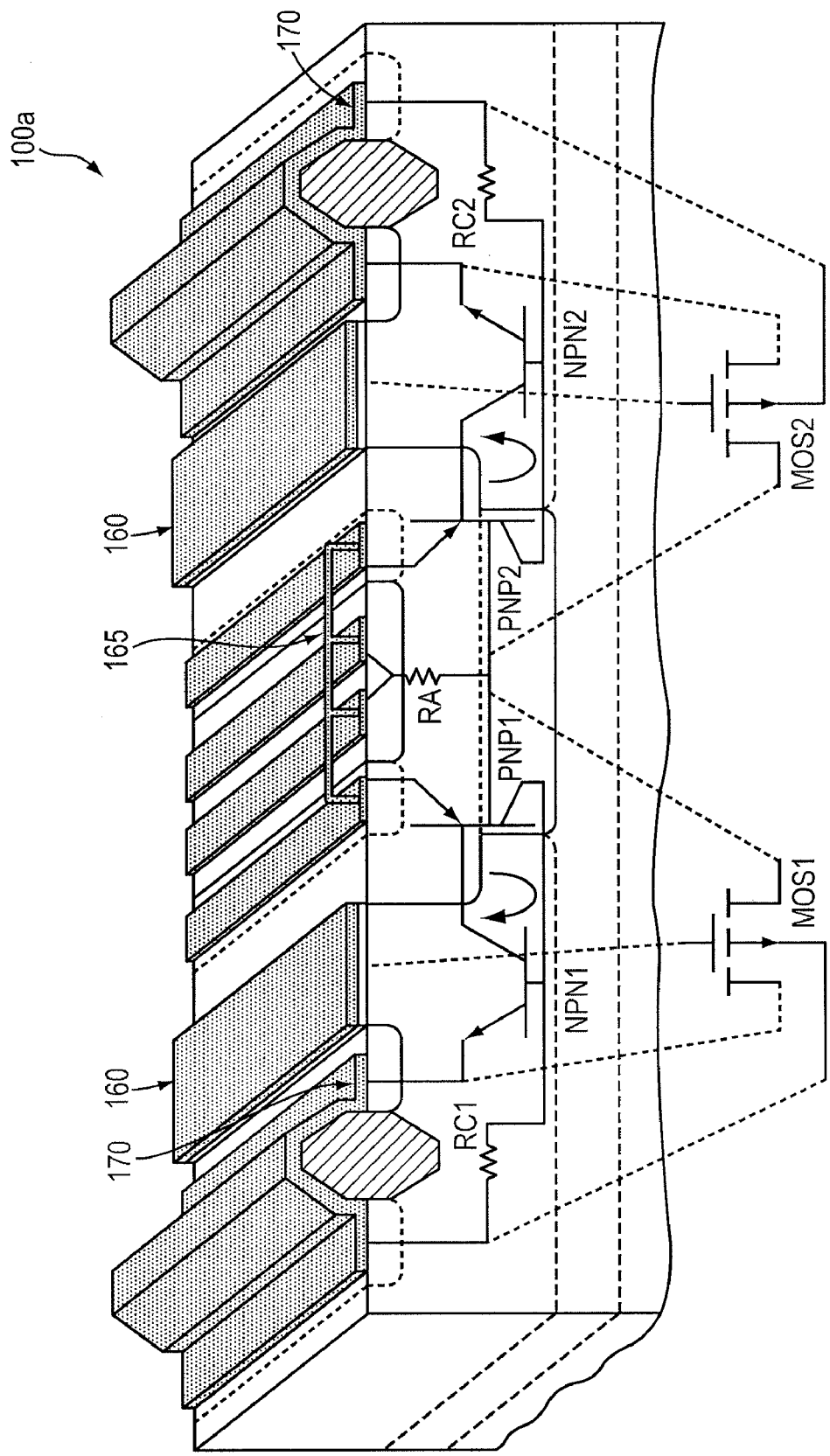
FIG. 1D is a schematic perspective diagram of the embodiment of FIG. 1A, further illustrating the equivalent electronic components inherent in the clamp structure.

The MOS structures 100a, 100b, 100c further include highly-doped shallow regions formed in the deep-well regions 110, 115, whose dopant concentration is comparatively lower. For ease of reference, well region 110 will, in the following discussion, have a negative conductivity type and be referred to as the n-well, and the adjacent well regions 115 will be referred to as p-wells. It should be noted, however, that the scope of the invention also includes embodiments wherein positive and negative dopants are exchanged in all the doped regions, i.e., where regions herein referred to as n-doped are p-doped and vice versa. In the n-well 110, a negatively doped ("$n^+$") shallow region 130, and surrounding positively doped ("$p^+$") shallow regions 135 are formed. The p-wells 115 include negatively doped ("$n^+$") shallow regions 140. Collectively, the $p^+$-region 135, n-well 110, p-well 115, and $n^+$-region 140 provide a thyristor-type conductivity modulation that serves to block currents at operating voltages, and to shunt currents at excess voltages, i.e., at voltages beyond a predetermined trigger voltage. The $p^+$-regions 135 inject hole majority carriers that help abruptly drop the holding voltage after the trigger voltage is reached, thereby avoiding heat-induced failure, and improving the over-voltage stress handling capability of the device. The $n^+$-region and $p^+$-regions 130, 135 may be abutted (as shown in FIG. 1A), or spaced apart (see, e.g., FIG. 1C). FIG. 1D shows a schematic representation of equivalent parasitic components inherent in MOS structure 100a. The deep-well ballast resistance RA depends on the spacing between the highly doped regions 130, 135, and the contact resistance between these regions and the terminal 165. Adding spacing between regions 130, 135 results in a higher ballast resistance RA, which, in turn, implies higher base resistance in the parasitic bipolar transistors PNP1, PNP2, as well as higher drain resistance in the planar MOS formations MOS1, MOS2. The spacing may be defined to achieve a combination of high over-voltage clamping robustness and low leakage current.

Typically, but not necessarily, the p-wells 115 further include shallow $p^+$-regions 145. These regions 145 may be separated from the $n^+$-regions 140 by ballasting oxide, which may be implemented, for example, by local oxidation of silicon (LOCOS), as shown in FIG. 1A, or by shallow trench isolation (STI), as illustrated in FIGS. 1B and 1C. Separating the $n^+$- and $p^+$-regions 140, 145 in this way serves to increase the resistance in the parasitic bipolar junction transistors NPN1, NPN2 that are formed by the $n^+$-regions 140 (emitter), the p-wells 115 (base), and the n-well 110 (collector), as indicated in FIG. 1D. An increased base resistance, in turn, aids in building the base voltage required to quickly turn on the parasitic transistors NPN1, NPN2 during a transient over-voltage, i.e., to cause snapback onset.

In some embodiments, ballasting may also be added to the n-well 110. For example, embodiment 100b, shown in FIG. 1B, includes STI trenches 155 that separate the $p^+$-region 135 from the junction between the n-well 110 and the p-well 115; and embodiment 100c, shown in FIG. 1C, includes STI trenches 157 between the $n^+$-region 130 and the $p^+$-regions 135. The inter-well isolations 157 in the first terminal may contribute to an increased base resistance RA of the parasitic PNP bipolars (indicated in FIG. 1D), and reduce the leakage current. Moreover, they may cause a more uniform current distribution in the on-state of the clamp structure, diverting currents into deeper regions of the silicon substrate, and away from the surface.

The structures further include MOS gates 160 disposed on the substrate 105, in regions that overlap the p-wells 115 and, in some embodiments, also the n-well 110 (see FIGS. 1B and 1C). The MOS gate may include an oxide or other isolating layer with high dielectric constant, and a polysilicon or metallic contact layer thereover. If polysilicon is used, it may be positively or negatively doped at a high concentration. The shallow regions 130, 135 in the n-well 110 may be electrically connected to each other and to a first terminal 165 by a conductive material such as, e.g., silicide, aluminum, or copper. The shallow regions 140, 145 in the p-wells 115 may likewise be shorted together, and are connected to a second terminal 170. The first terminal 165 may act as the drain, and the second terminal 170 as the source, or vice versa. In alternative embodiments, the shallow regions 130, 135, 140, 145 may be connected to separate terminals constituting individual device control pins. Adding trench isolation 155 between the MOS gate 170 and the first terminal 165, as in clamp embodiments 100b, 100c, may increase the operating voltage between gate 170 and terminal 165 that the clamp can safely sustain.

The performance of fast over-voltage-protection devices can be characterized by TLP(transmission-line-pulse) testing. Therein, high-current pulses are applied to a device under test (DUT) at successively higher levels through a transmission line (e.g., a coaxial cable) of specified length. The pulses are of a current amplitude and duration representative of the "human body model" (HBM). Quasi-static device voltage and current are measured during the substantially flat top of each pulse to develop a TLP current-voltage (I-V) curve for the device. Further, potential damage may be assessed by measuring the leak current at the operating voltage following each test pulse.

Figure 2A:
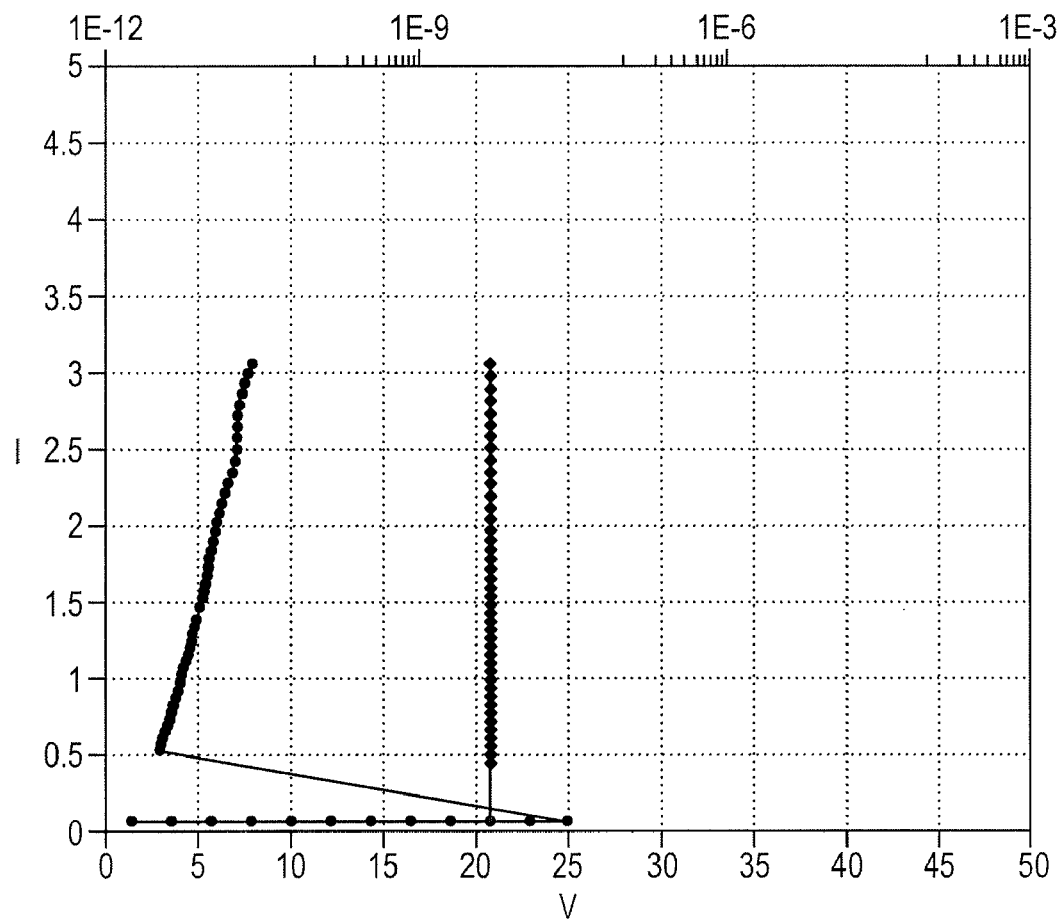
FIG. 2A graphically illustrates the current-voltage characteristics of the embodiment illustrated in FIG. 1A under transmission-line-pulse (TLP) testing.

FIG. 2A illustrates the I-V characteristic of a clamp structure 100a in response to TLP testing. The clamp measures 42 µm by 58 µm, and is designed for use at, typically, 15 V operating voltage and at room temperature. The 100-ns TL pulses have been defined in this measurement for a current limit of 3 A, equivalent to over 4 kV HBM. The clamp triggers at a voltage of about 25 V, and drops to a holding voltage of about 2.5 V, which increases with subsequent test pulses. During normal operating conditions, the clamp is stable and does not affect the circuit functionality. The wide gap between the operating voltage and the trigger voltage serves to avoid false triggering of the clamp. The leak current, tested at 15 V, is stable at less than 3 nA for TLP currents up to 3 A. Thus, this clamp embodiment may sustain elevated ESD stress conditions and safely protect high voltage inputs and outputs. It has a small foot print, and a relatively low leakage current that results in high energy efficiency.

Figure 2B:
FIG. 2B graphically illustrates the current-voltage characteristics of a prior-art clamp structure under TLP testing.
Figure 2B:
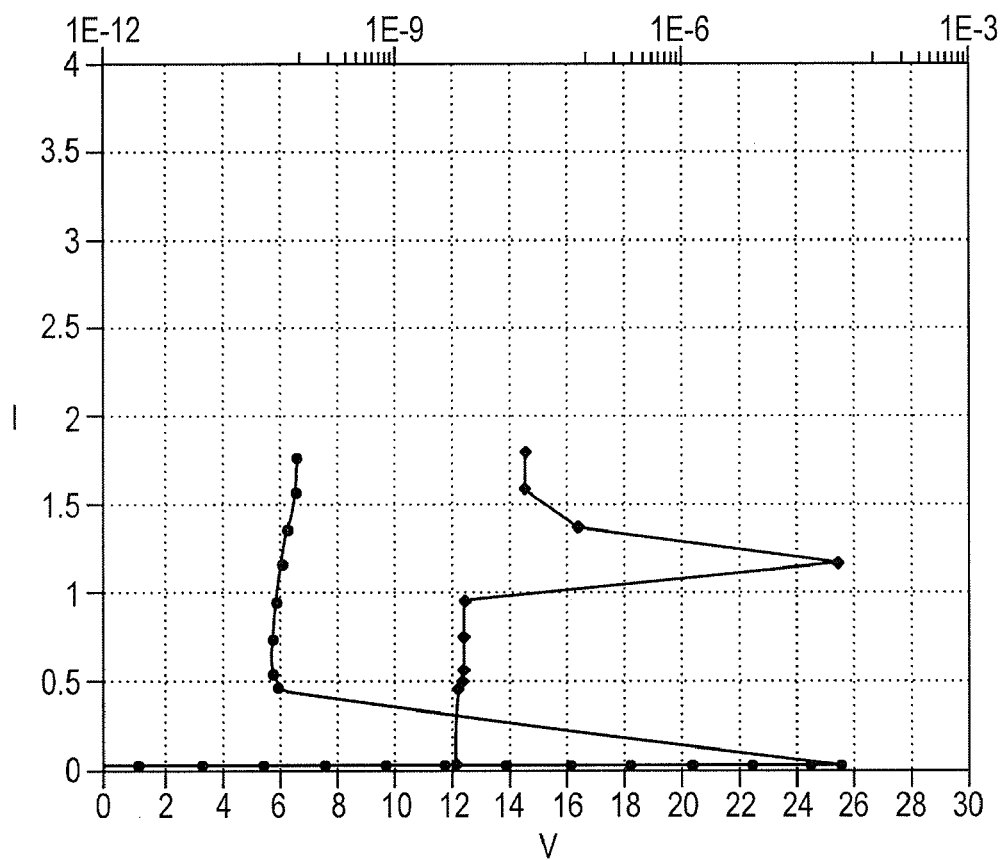
Figure 2C:
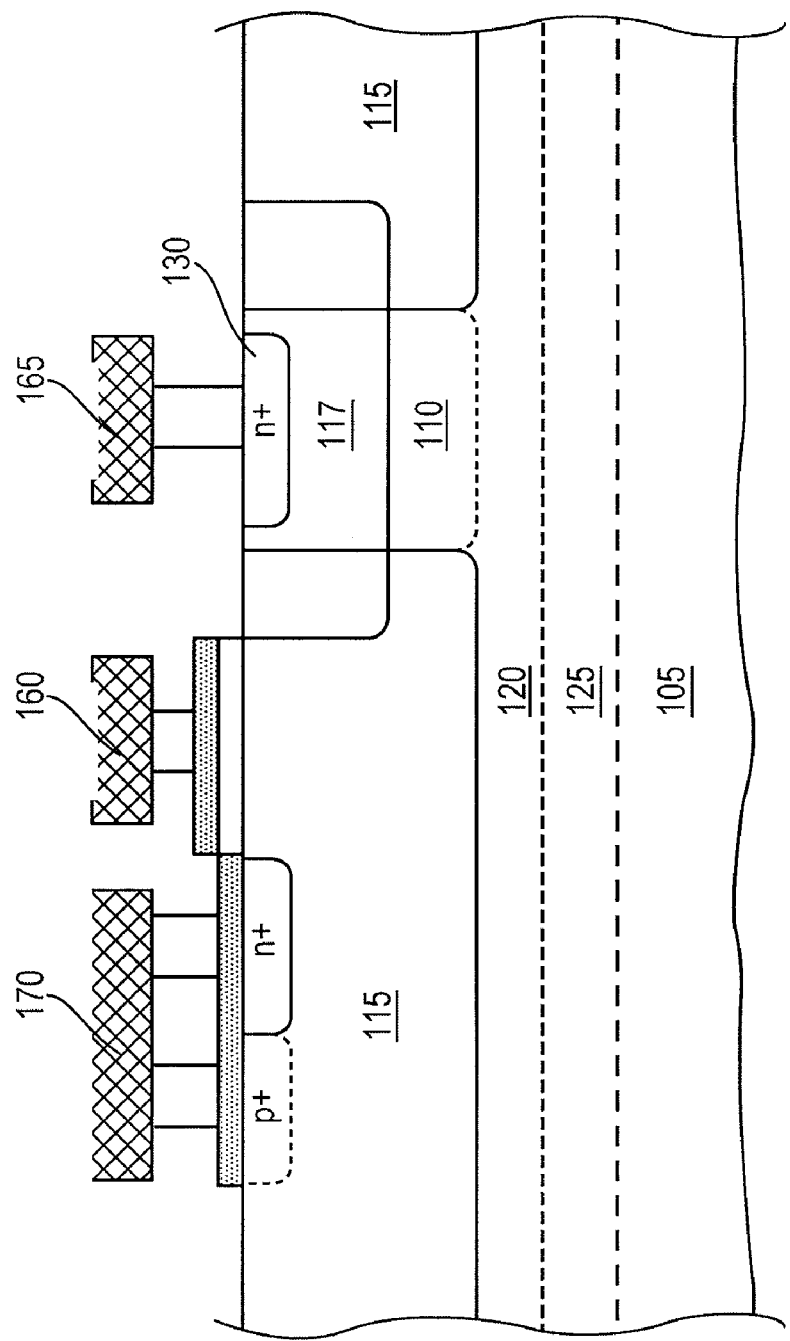
FIG. 2C is a schematic perspective diagram of the prior-art clamp structure whose current-voltage characteristic is shown in FIG. 2B.

For comparison, the TLP I-V characteristic of a prior-art standard MOS clamp device that has optimized drain-gate spacing, but is lacking the complementary shallow well regions 135 adjacent the gate and adequate ballasting, is shown in FIG. 2B. The prior-art device itself is illustrated in FIG. 2C. This clamp measures 200 mm by 200 mm, and is tested using the same TLP parameters as described with respect to FIG. 2A. At a trigger voltage of about 26 V, snapback to a holding voltage of about 6 V (corresponding to a current of 0.5 A) occurs; this holding voltage is significantly larger than for the clamp structure 100a. The leakage current increases slightly immediately after snapback, indicating a soft failure. After soft failure, the I-V curve cannot be reproduced in the same way, which poses long-term reliability problems in the device. Further, power consumption of the system drastically increases over time, as is typical in certain electronic systems that heat up during usage over time. At 1 A, the device fails completely, as evidenced by the sudden spike in the leakage current. Due to the soft failure following snapback, this device is not reliable as a voltage clamp. In particular, it is not a viable solution for zero-defect IC applications.

Various clamp embodiments according to the invention are also advantageous in that their trigger voltages do not shift significantly with varying time characteristics of the input signal. For example, TLP testing of clamp embodiment 100a revealed that the trigger voltage shifts only from about 25 V to about 20 V when the pulse rise time is varied between 10 ns and 200 ps. In each case, the trigger voltage is significantly above the operating voltage (15 V), which ensures that the clamp is not activated under normal operation conditions.

Figure 3A:
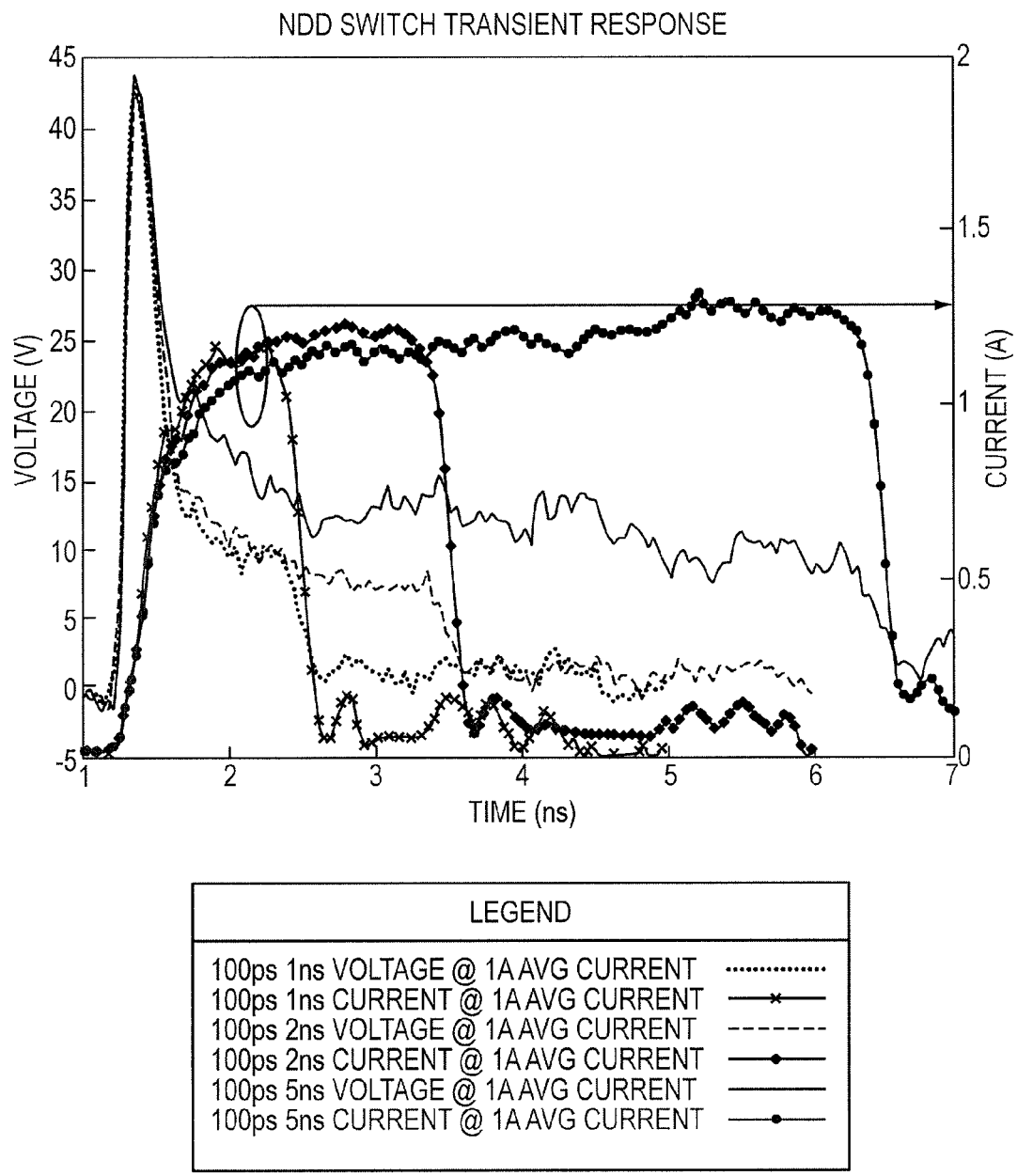
FIG. 3A graphically illustrates the fast transient current and voltage characteristics of the embodiment illustrated in FIG. 1A for various pulse widths.

The ability of a voltage clamp to effectively protect an IC circuit from ESD stress conditions further depends on the switching speed of the clamp. Many slow clamp devices which sustain ESD stresses satisfactorily do nevertheless not protect the circuits because they do not turn on fast enough. Embodiments of the present invention may undergo full conductivity modulation—from blocking behavior to full current conduction through the device—within a few nanoseconds. This time-scale is generally short enough to protect the IC. FIG. 3A illustrates the transient over-voltages and currents for clamp embodiment 100a as a function of time for 75-V pulses with widths of 1.2 ns, 2 ns and 5 ns and a rise time of 100 ps. For all pulse widths, the response time is less than 2 ns. The first voltage impulse (i.e., the voltage overshoot) does not exceed 45 V. Once the device has triggered, the holding voltage is initially high, guarantee that not latching condition is obtained, and drops over time as the clamp is continuingly subject to high stress. This behavior drastically expands the robustness of the clamp, and makes it highly reliable for switching applications.

Figure 3B:
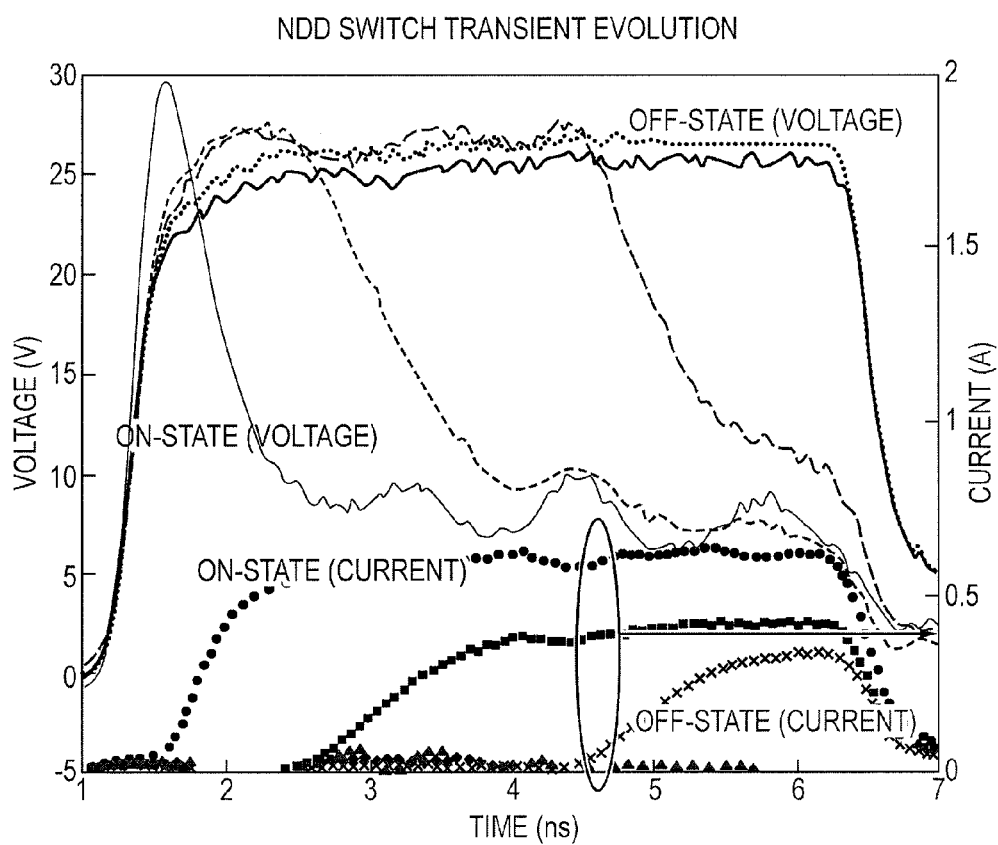
FIG. 3B graphically illustrates the transient current and voltage characteristics of the embodiment illustrated in FIG. 1A near the trigger point for various pulse voltages.

FIG. 3B shows the current and voltage response of clamp embodiment 100a for various pulse voltages close to the trigger point, i.e., V1=26 V (off), V2=27 V (off), V3=28 V (start turn-on), V4=29 (faster turn-on in response to higher pulse), and V5=40 V (full turn-on), illustrating the stability of the device in that regime. Just below the trigger point, the clamp device remains in the off-state, i.e., does not conduct any substantial currents. At a slightly higher pulse voltage of about 28 V, the clamp initially sustains that voltage, but turns on after about 4.5 ns, dropping to a lower holding voltage and conducting current. At increasingly higher pulse voltages, the turn-on point shifts in time towards the onset of the TL pulse, and the response characteristics increasingly resemble those shown in FIG. 3A.

Figure 4A:
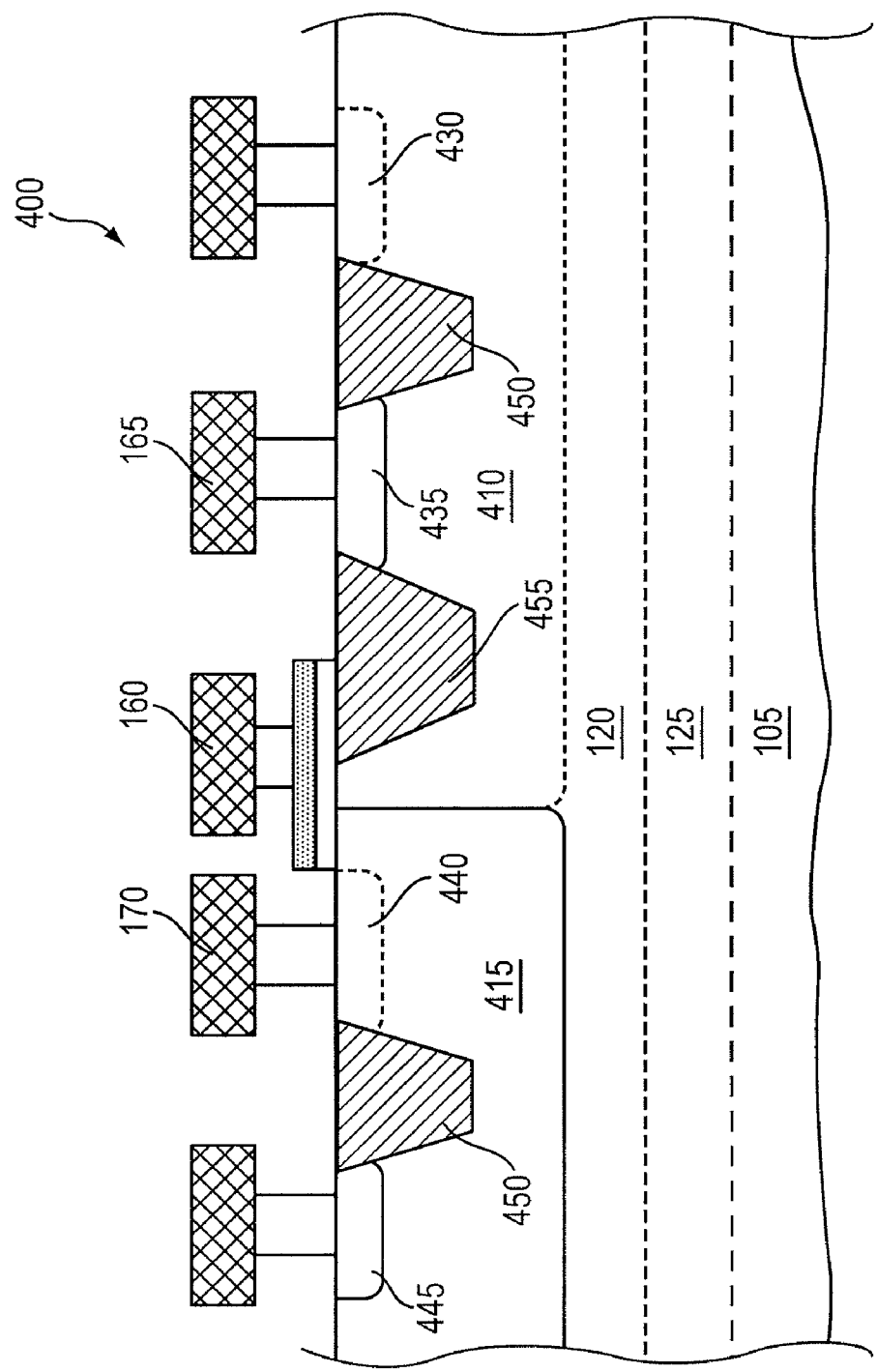
FIG. 4A is an exemplary sectional diagram of a topologically asymmetric clamp structure in accordance with one embodiment of the invention.

Various functionally advantageous structural features of the embodiments described above may also be implemented in modified clamp embodiments. For example, while topologically symmetric clamp embodiments, such as those illustrated in FIGS. 1A-1C, may have particularly advantageous ESD protection characteristics, the invention is not limited to this preferred embodiment. FIG. 4A illustrates an embodiment 400 including only one n-well 410 and one p-well 415. Highly doped n+- and p+-regions 430, 435 are implanted in the n-well 410, and, similarly, highly doped n+- and p+-regions 440, 445 are implanted in the p-well 415. Isolating regions 450, 457 are formed between the highly doped regions 440, 445 and 430, 435 of opposite conductivity types in the n-well 410 and p-well 415, respectively. Further, an isolating region 455 is formed in the deep wells 410 between the p+-region 435 and the gate structure 160.

Figure 4B:
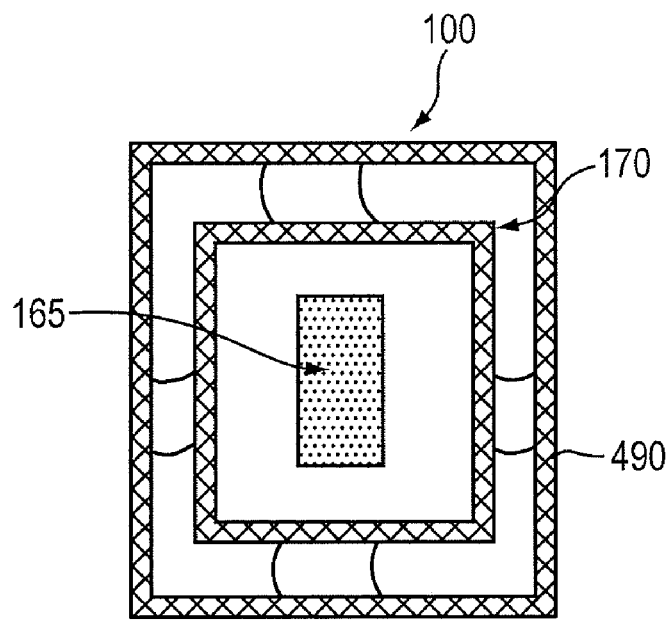
FIG. 4B is a schematic top view of a topologically symmetric clamp structure in accordance with some embodiments.
Figure 4C:
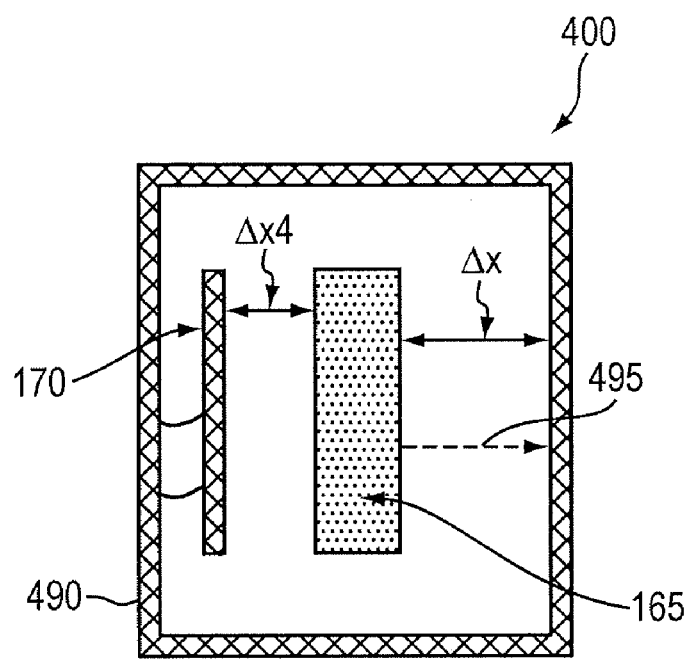
FIG. 4C is a schematic top view of a topologically asymmetric clamp structure in accordance with some embodiments.

FIGS. 4B and 4C are top views of topologically (and, as shown, also geometrically) symmetric and asymmetric clamp implementations, respectively. Both implementations include an outer ring 490, which serves to isolate the electronic components in its interior region from the surrounding circuitry. This outer ring 490 is electrically connected to the second terminal 170 of the respective clamp structure. In the symmetric clamp embodiment 100, shown in FIG. 4B, the second terminal 170 forms a ring around the first terminal 165 in the center of the structure, effectively shielding the first terminal 165 from the outer ring 490. In this configuration, the conduction from the first terminal 165 to the second terminal 170 occurs without risk of activating an undesirable parasitic current path. By contrast, in the asymmetric embodiment 400, shown in FIG. 4C, a conduction path 495 exists between the outer ring 490 and the first terminal 165, which is separated from the outer ring by the second terminal 170 on one side only. To avoid breakdown along this conduction path 490 during turn-on of the device, the spacing Δx between the first terminal 165 and outer ring 490 needs to have a certain minimum length, which may be over 10 microns for high-voltage processes. Further, compared to the symmetric embodiment, sizing of an asymmetric device may need to be adjusted to compensate for the lack of the radial current path between the first and second terminals 165, 170, and sustain the stress level via one-side conduction.

Figure 5A:
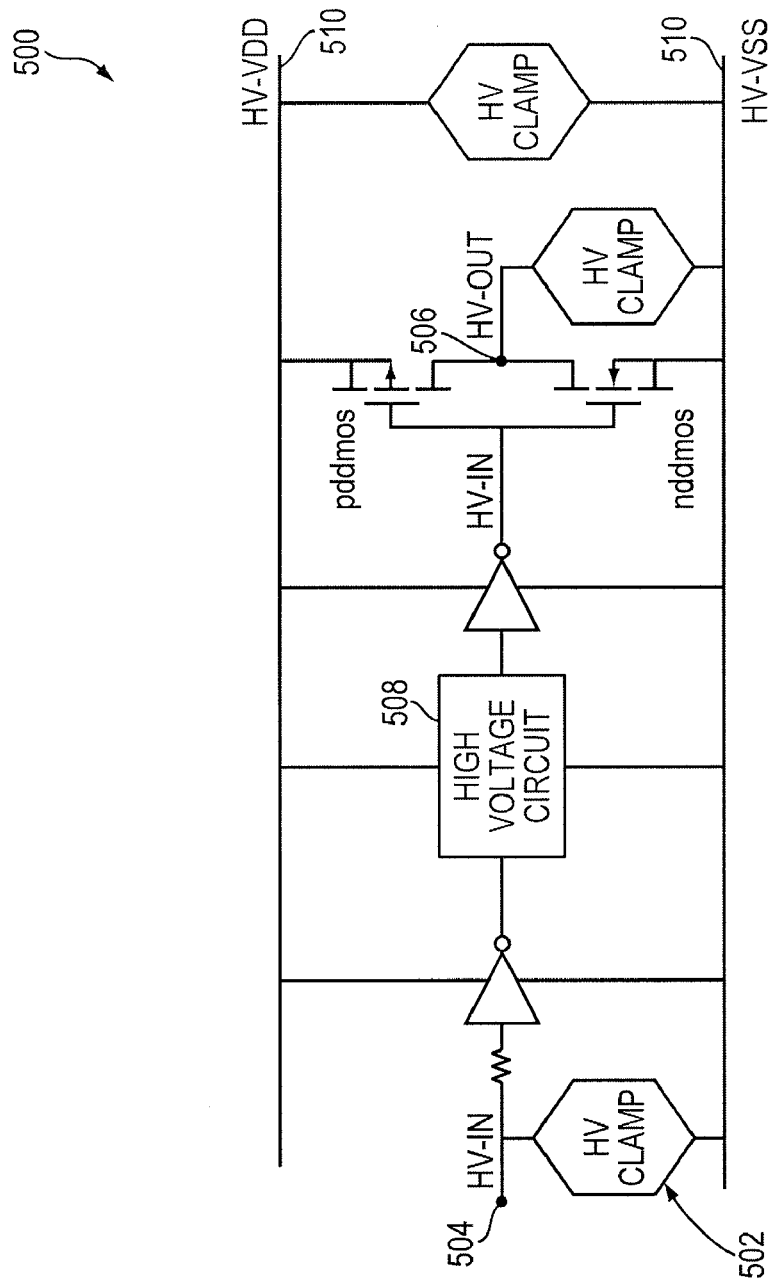
FIGS. 5A-5D are circuit diagrams illustrating applications of over-voltage clamps in accordance with various embodiments of the invention.
Figure 5B:
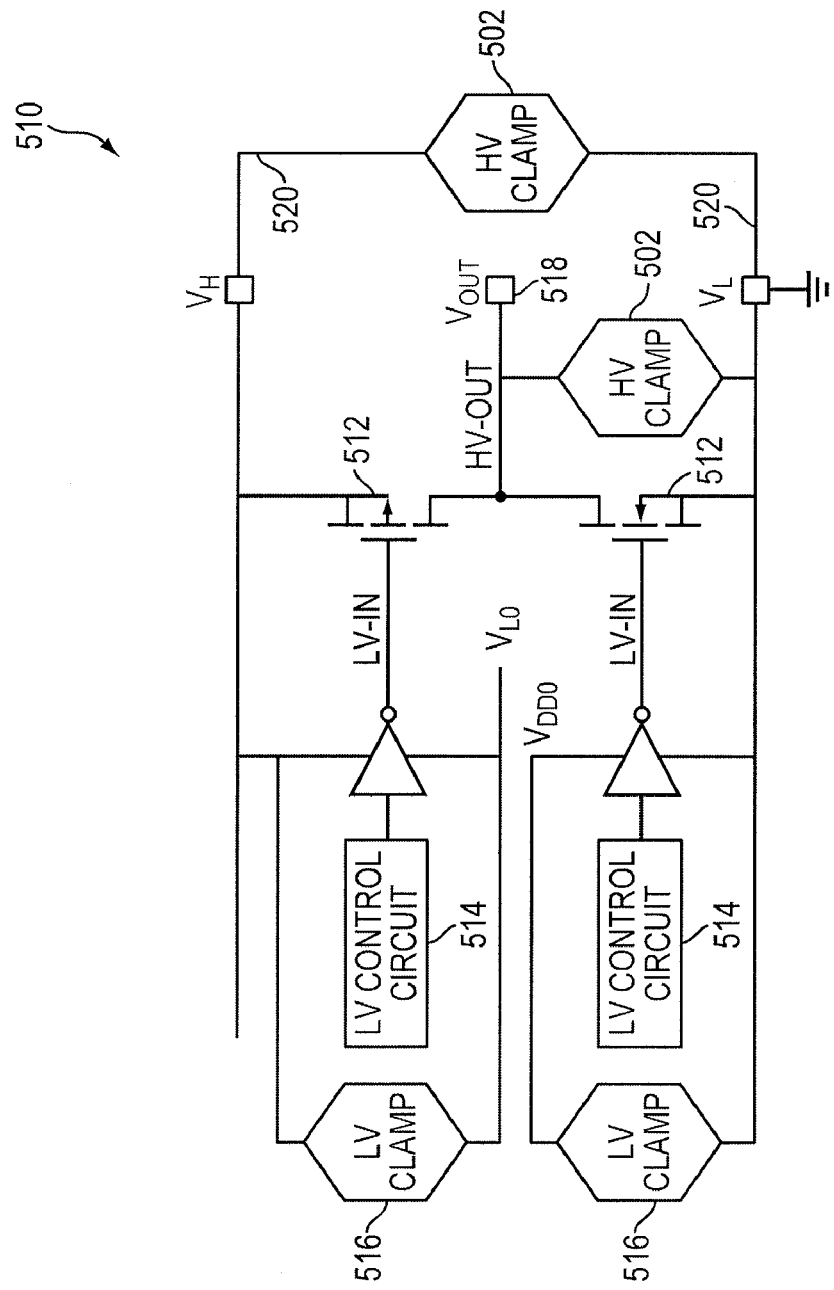

Transient over-voltage clamps according to various embodiments may be used in high-voltage double-diffused and bipolar/CMOS/DMOS integrated circuit applications, such as, for example, mixed-signal high-voltage analog circuits for imaging, medical, and industrial systems. The circuit diagrams of FIGS. 5A-5D illustrate how the clamps may be incorporated into various electronic circuits and components of systems-on-a-chip. In the circuit 500 shown in FIG. 5A, ESD protection clamps 502 are used at the input 504 and output 506 of a high-voltage internal circuit 508, as well as between the power rails 510. FIG. 5B illustrates a circuit 510 including high-voltage MOSFETS 512 that are controlled by low-voltage control CMOS/BiCMOS circuits 514. Here, conventional lower-voltage clamps 516 are incorporated to protect the control circuits 514, whereas high-voltage clamp embodiments 502 provide ESD protection at the output 518 and between the power rails 520.

Figure 5C:
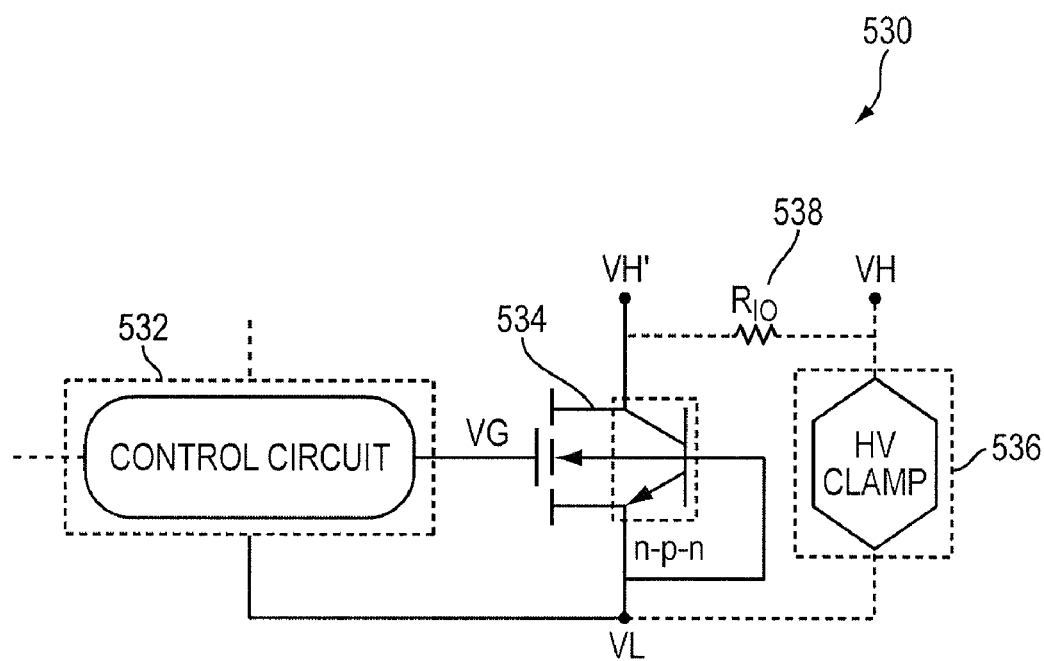

FIG. 5C illustrates a circuit 530 with a low-voltage or high-voltage input control circuit 532, and a high-voltage n-type output driver 534 in parallel with over-voltage protection. The over-voltage protection clamp 536 in conjunction with the input-output resistor 538 ($R_{IO}$) reduces the effective current going through the high-voltage output driver 534 during very fast transients. Due to the fast response of clamp structures in accordance with various embodiments, reliable protection of very sensitive high voltage MOSFET/DDMOS/DMOS devices may be achieved even if the resistance of the input-output resistor is limited to values below 50Ω, as necessary for a variety of IC applications.

Figure 5D:
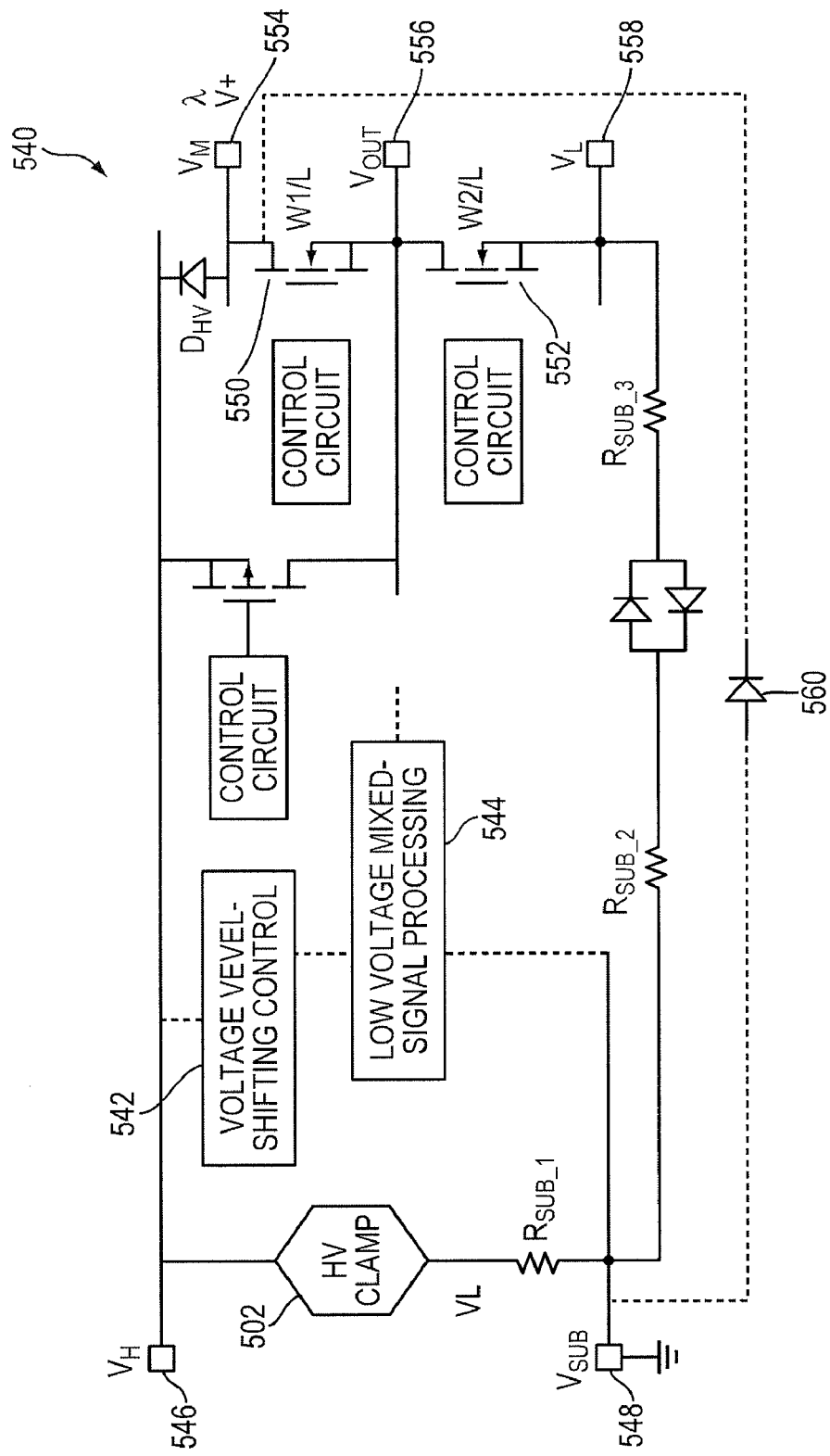

FIG. 5D illustrates an exemplary implementation of multiple high-voltage switches in a charge coupled circuit 540 for digital imaging. Herein, the over-voltage clamp 502 is connected in parallel with a high-voltage driver 542 and a low-voltage signal-processing circuit 544. The high voltage clamp 542 serves to maintain the voltage difference between a high-voltage terminal 546 ($V_H$) and a low-voltage terminal 548 ($V_{sub}$) in a predictable range, and to prevent destructive failure in the high-voltage switch devices 550, 552 (between terminals 554 ($V_M$) and 556 ($V_{OUT}$) and terminals 556 ($V_{OUT}$) and 558 ($V_L$), respectively) due to reverse breakdown in the high-voltage isolation parasitic diode 560 (between terminals 548 ($V_M$) and 558 ($V_{sub}$)) resulting from transient over-voltage stress. The switch devices 550, 552 may themselves be implemented using structures in accordance with various embodiments of this invention, resulting in gate-bias controllability during circuit operation and over-voltage clamping properties.

Having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A voltage clamp device comprising:
    (a) a substrate;
    (b) a lightly doped first deep region formed in the substrate;
    (c) a lightly doped second deep region formed in the substrate adjacent the first deep region, wherein a lateral boundary is formed between the first and second deep regions;
    (d) highly doped first and second shallow regions formed in the first deep region;
    (e) highly doped third and fourth shallow regions formed in the second deep region, wherein the third shallow region has a lateral surface facing the first deep region;
    (f) a first terminal electrically connected to the first shallow region;
    (g) a second terminal electrically connected to the third shallow region; and
    (h) a gate structure comprising an insulating layer and a gate electrode disposed on the insulating layer, at least a portion of the gate structure overlapping the second deep region, wherein the gate structure extends from over the lateral surface of the third shallow region to over the boundary;
    wherein (i) the second shallow region is located between the first and third shallow regions, and the third shallow region is located between the second and fourth shallow regions, and (ii) the first deep region and the first and third shallow regions are of a first conductivity type, and the second deep region and the second and fourth shallow regions are of a second, opposite conductivity type.

2. The device of claim 1, wherein the voltage clamp device includes a metal oxide semiconductor (MOS) device having a gate, a drain, and a source, wherein the first terminal operates as one of the drain or the source of the MOS device, and the second terminal operates as the other one of the drain or the source of the MOS device, and wherein the gate structure forms the gate of the MOS device such that a voltage between the gate and the source of the MOS device controls a current between the drain and the source of the MOS device.

3. The device of claim 1, further comprising an epitaxial layer formed within the substrate underneath the first and second deep regions.

4. The device of claim 1, further comprising a deep implant layer formed between the epitaxial layer and the first and second deep regions.

5. The device of claim 1 wherein the second shallow region is electrically connected to the first terminal.

6. The device of claim 1 wherein the fourth shallow region is electrically connected to the second terminal.

7. The device of claim 1 further comprising at least one isolating barrier.

8. The device of claim 7 wherein the at least one isolating barrier comprises at least one of a shallow trench isolation or a ballasting oxide barrier.

9. The device of claim 7 wherein the at least one isolating barrier is located between at least one of the first and second shallow regions, the third and fourth shallow regions, or the second shallow region and the second deep region.

10. The device of claim 1 further comprising
    a lightly doped third deep region of the second conductivity type formed in the substrate adjacent the first deep region and opposite the second deep region;
    a highly doped fifth shallow region of the second conductivity type formed in the first deep region so that the first shallow region is located between the second and fifth shallow regions; and
    highly doped sixth and seventh shallow regions formed in the third deep region, the sixth shallow region being of the first conductivity type and being located between the fifth and seventh shallow regions, and the seventh shallow region being of the second conductivity type.

11. The device of claim 10 further comprising isolating barriers, each barrier being selected from the group consisting of a shallow trench isolation region and a ballasting oxide barrier.

12. The device of claim 11 wherein the isolating barriers comprise barriers located between the third and fourth shallow regions and between the sixth and seventh shallow regions.

13. The device of claim 11 wherein the isolating barriers comprise barriers located between the first and second shallow regions and between the first and fifth shallow regions.

14. The device of claim 11 wherein the isolating barriers comprise barriers located between the second shallow region and the second deep region, and between the fifth shallow region and the third deep region.

15. The device of claim 1 further comprising a medium-doped region of the first conductivity type embedded in the first deep region and in part of the second deep region, and encompassing the first and second shallow regions.

16. The device of claim 15 wherein an edge of the medium-doped region is flush with a nearest edge of the gate structure.

17. A voltage clamp device including a metal oxide semiconductor (MOS) device formation having a gate, a drain, and a source, the voltage clamp device comprising:
   (a) a substrate;
   (b) formed in the substrate, a lightly doped first deep region of a first conductivity type and, adjacent the first deep region on opposite sides thereof, lightly doped second deep regions of a second conductivity type;
   (c) formed in the first deep region, a highly doped first shallow region of the first conductivity type and, on opposite sides of the first shallow regions, highly doped second shallow regions of the second conductivity type;
   (d) formed in each of the second deep regions, a highly doped third shallow region of the first conductivity type,
   (e) a first terminal electrically connected to the first shallow region, wherein the first terminal operates as one of the drain or the source of the MOS device;
   (g) a second terminal electrically connected to the third shallow regions, wherein the second terminal operates as the other one of the drain or the source of the MOS device; and
   (h) gate structures comprising insulating layers and gate electrodes disposed on the insulating layers, at least a portion of the gate structures overlapping the second deep regions, the gate structures forming the gate of the MOS device such that a voltage between the gate and the source of the MOS device controls a current between the drain and the source of the MOS device.

18. The device of claim 17 wherein the second shallow regions, the first and second deep regions, and the third shallow regions collectively have a thyristor-type response.

19. A planar MOS device structure operative as a switch and as a voltage clamp, comprising:
   a substrate;
   a first well of a first conductivity type disposed in the substrate;
   a second well of a second conductivity type disposed in the substrate adjacent the first well;
   a gate structure disposed over the substrate and overlapping at least a portion of the second well;
   on a first side of the gate structure, a first highly doped region of the first conductivity type disposed in the second well, wherein the first highly doped region has a lateral surface facing the first well;
   on a second side of the gate structure, a second highly doped region of the first conductivity type disposed in the first well, wherein the second highly doped region is separated from the gate structure by (i) a third highly doped region of the second conductivity type formed in the first well, and (ii) at least one of spacing or ballasting; and
   a fourth highly doped region of the second conductivity type, wherein the first highly doped region is located between the fourth highly doped region and the gate structure,
   wherein the gate structure extends from over the lateral surface of the first highly doped region to over a boundary between the first and second wells.

20. The planar MOS structure of claim 19 wherein the first highly doped region is connected to a first terminal, and the second highly doped region is connected to a second terminal.

21. The planar MOS structure of claim 20 wherein a voltage between the first terminal and the gate is lower than a voltage between the second terminal and the gate.

22. An electronic circuit comprising:
   a substrate;
   a first well of a first conductivity type disposed in the substrate;
   a second well of a second conductivity type disposed in the substrate adjacent the first well;
   an integrated circuit; and
   connected to an input or output or between power rails of the integrated circuit, a planar MOS structure operative as a voltage clamp, comprising (i) a gate structure disposed on the substrate and overlapping at least a portion of the second well (ii) on a first side of the gate structure, a first highly doped region of the first conductivity type disposed in the second well, wherein the first highly doped region has a lateral surface facing the first well; and (iii) on a second side of the gate structure, a second highly doped region of the first conductivity type disposed in the first well, wherein the second highly doped region is separated from the gate structure by (A) a third highly doped region of the second conductivity type formed in the first well, and (B) at least one of spacing or ballasting,
   wherein the gate structure extends from over the lateral surface of the first highly doped region to over a boundary between the first and second wells.

* * * * *

UNITED STATES PATENT AND TRADEMARK OFFICE
CERTIFICATE OF CORRECTION

PATENT NO.         : 8,044,457 B2
APPLICATION NO.    : 12/493692
DATED              : October 25, 2011
INVENTOR(S)        : Javier A. Salcedo et al.

It is certified that error appears in the above-identified patent and that said Letters Patent is hereby corrected as shown below:

At column 10, line 34 (Approx), in Claim 4, please change "1," to --3,--.

Signed and Sealed this
Tenth Day of April, 2012

David J. Kappos
*Director of the United States Patent and Trademark Office*